(12) United States Patent
Catchmark et al.

(10) Patent No.: US 7,585,334 B2
(45) Date of Patent: Sep. 8, 2009

(54) MANUFACTURING METHOD FOR MOLECULAR RULERS

(75) Inventors: Jeffrey M. Catchmark, Bellefonte, PA (US); Gregory S. McCarty, State College, PA (US); Anat Hatzor-de Picciotto, New Providence, NJ (US); Guy P. Lavallee, State College, PA (US); Michael A. Rogosky, Port Matilda, PA (US)

(73) Assignee: The Penn State Research Foundation, University Park, PA (US)

( * ) Notice: Subject to any disclaimer, the term of this patent is extended or adjusted under 35 U.S.C. 154(b) by 480 days.

(21) Appl. No.: 11/065,742

(22) Filed: Feb. 25, 2005

(65) Prior Publication Data

US 2005/0244758 A1    Nov. 3, 2005

Related U.S. Application Data

(60) Provisional application No. 60/548,825, filed on Feb. 27, 2004.

(51) Int. Cl.
*H01L 21/00* (2006.01)
(52) U.S. Cl. .................................. 29/25.01; 438/99
(58) Field of Classification Search ............ 438/48, 438/99, 691, 585; 257/40, 9, 14, 288; 29/25.01
See application file for complete search history.

(56) References Cited

U.S. PATENT DOCUMENTS

| | | | |
|---|---|---|---|
| 6,313,019 B1* | 11/2001 | Subramanian et al. | 438/585 |
| 6,610,608 B1* | 8/2003 | Okada et al. | 438/724 |
| 6,859,299 B1* | 2/2005 | Chiao | 359/290 |
| 7,015,062 B1* | 3/2006 | Weiss et al. | 438/99 |
| 7,119,356 B2* | 10/2006 | Bao et al. | 257/9 |
| 2004/0005258 A1* | 1/2004 | Fonash et al. | 422/271 |
| 2004/0014253 A1* | 1/2004 | Gupta et al. | 438/48 |
| 2004/0209392 A1* | 10/2004 | Craighead et al. | 438/48 |

OTHER PUBLICATIONS

Bailey, T. et al., "Step and flash imprint lithography: Defect analysis", Oct. 1, 2001, www.molecularimprints.com, vol. 19 No. 6, pp. 2806-2810.*

Bailey, T. et al., "Step and flash imprint lithography: Defect analysis", Oct. 1, 2001, www.molecularimprints.com, vol. 19 No. 6, pp. 2806-2810.*

Hatzor, A., et al. "Molecular Rulers for Scaling Down Nanostructurs" Sience, Fol. 291, Feb. 9, 2001, pp. 1019-1020.

* cited by examiner

*Primary Examiner*—Richard A. Booth
(74) *Attorney, Agent, or Firm*—McKee, Voorhees & Sease, P.L.C.

(57) ABSTRACT

A multi-layer resist process is used to define a sacrificial host structure used to produce a molecular ruler useful for defining structures via a lift-off type process. By using this process, the removal of the host structure is significantly simplified, and a structure is formed which is perfect for achieving a reproducible high yield lift-off. Moreover, the processes disclosed are completely compatible with volume IC manufacturing processes, and uses a minimum of the organic material which, in a high volume production application, will dramatically reduce solution depletion.

18 Claims, 3 Drawing Sheets

MANUFACTURING METHOD FOR MOLECULAR RULERS

CROSS-REFERENCE TO RELATED APPLICATIONS

This application claims priority to U.S. Provisional Patent Applications Ser. No. 60/548,825 filed Feb. 27, 2004, which is incorporated by reference herein in its entirety.

FIELD OF THE INVENTION

The present invention relates to a new high yield manufacturing process for using molecular rulers to scale down nanostructures.

BACKGROUND OF THE ART

Various industries are looking for ways to produce smaller and faster devices and therefore have great interest in producing nanostructures. One significant problem with methods of producing nanostructures is that the methods used are not suitable for manufacturing. There is a need for simple, reproducible processes for patterning features on the nanometer scale. Emerging optical, electronic and molecular devices require structures to be produced with feature sizes on the order of a few nanometers to 100 nm or more. Direct write electron beam lithography is capable of producing patterns on the order of about 20 nm, but this process is expensive and time consuming. Also, features less than about 10 nm are extremely difficult to produce. A manufacturable process for using optical lithography to obtain feature sizes on the order of 50 nm or less would provide e-beam like patterning capabilities for a fraction of the cost. Such processes must be reproducible and very high yield to make an impact in the device fabrication industry. Also, manufacturable processes for forming structures less than 50 nm are needed for advanced device fabrication in many industries including electronics and biotechnology.

SUMMARY OF THE INVENTION

Therefore, it is a primary object of the present invention to improve upon the state of the art.

It is a further object, feature, or advantage of the present invention to provide a high yield manufacturing process for using molecular rulers to scale down nanostructures.

A still further object, feature, or advantage of the present invention is to provide for a reproducible process for patterning features on the nanometer scale.

Another object, feature, or advantage of the present invention is to provide for a process for patterning features on a nanometer scale that allows for the manufacturing of features on the order of 50 nm or less.

Yet another object, feature, or advantage of the present invention is to replace conventional lift-off processes.

A further object, feature, or advantage of the present invention is to reduce consumption of organic molecules during molecular ruler formation.

One or more of these and/or other objects, features, or advantages of the present invention will become apparent from the specification and claims that follow.

According to one aspect of the invention, a host structure for the formation of a molecular ruler is provided. The host structure includes a first layer of sacrificial material disposed upon a surface of a substrate, a host material layer disposed upon a surface of the first layer of resist, a second layer of sacrificial material disposed upon the host material layer, and an opening extending from the second layer of sacrificial material to the surface of the substrate exposing a side of the layer of the host material. The sacrificial material can be a resist, an organic resist, LOR, a dielectric, silicon dioxide, silicon nitride, a metal such as nickel, or other material. The opening of the host structure can be produced through optical lithography, electron beam lithography, or other process.

According to another aspect of the invention, a method for producing nanoscale patterns is provided. The method includes fabricating a host structure comprising (a) a first layer of sacrificial material disposed upon a surface of a substrate, (b) a layer of host material disposed upon a surface of the first layer of resist, (c) a second layer of sacrificial material disposed upon the host material layer, and (d) an opening extending from the second layer of sacrificial material to the surface of the substrate exposing a side of the layer of the host material. Next, a molecular rule structure is produced by assembling at least one layer of organic molecules onto the exposed host material. A material is deposited onto the surface of the substrate and the host structure is removed with the attached molecular ruler structure. This methodology can replace a conventional lift-off process.

According to another aspect of the invention, a method for reducing exposed area of a host material to reduce consumption of organic molecules during molecular ruler formation is provided. The method includes depositing a second layer of sacrificial material disposed upon a host material layer. The sacrificial material can be, without limitation, a resist, an organic resist, LOR.

According to another aspect of the invention, a host structure for the formation of a molecular ruler is provided. The host structure includes a first layer of sacrificial material disposed upon a surface of a substrate, a second layer of sacrificial material disposed on top of and fully encapsulating the first layer of sacrificial material, a host material layer disposed upon a surface of the second layer of sacrificial material, a third layer of sacrificial material disposed upon the host material layer, and an opening extending from the second layer of sacrificial material to the surface of the substrate exposing a side of the layer of the host material. The sacrificial material layers can each be a resist, LOR, a dielectric or a metal. The first sacrificial material layer can be LOR and the second sacrificial material layer can be Shipley UV-5.

DETAILED DESCRIPTION OF THE INVENTION

The present invention relates to a high yield volume manufacturing process for using molecular rulers to define nanostructures. Specifically, a multi-layer resist process has been developed to define a sacrificial host structure used to produce a molecular ruler useful for defining structures via a lift-off type process. By using this process, the removal of the host structure is significantly simplified, and a structure is formed which is perfect for achieving a reproducible high yield lift-off. Moreover, the processes disclosed are completely compatible with volume IC manufacturing processes, and uses a minimum of the organic material which, in a high volume production application, will dramatically reduce solution depletion.

The use of self-assembled layers of organic molecules disposed on one or more host structures to define nanometer scale features has been demonstrated at the Penn State Nanofabrication facility by Dr. Anat Hatzor and Prof. Paul Weiss (*Science*, volume 291, pp. 1019-1020, 2001). These films have been referred to as molecular rulers since the organic molecules are of an exact length. This approach, however, is not practical for many applications in the form it is currently being implemented. An important example is the use of molecular rulers to produce metal lines on the nanometer scale using the lift-off processes. Metal lines on the order of 17 nanometers, in width have been demonstrated by Dr. Anat Hatzor and Prof. Paul Weiss. The process for producing these structures, however, is not compatible with volume integrated circuit production. This situation arises due to several issues with the formation of molecular rulers.

One of these issues is that the current process for forming a host structure involves depositing a metal pattern onto the surface of a given substrate. This host metal pattern needs to be selectively removed using a process which does not remove the material which has been selectively deposited using the molecular rulers as a lift-off mask.

Figure 1:
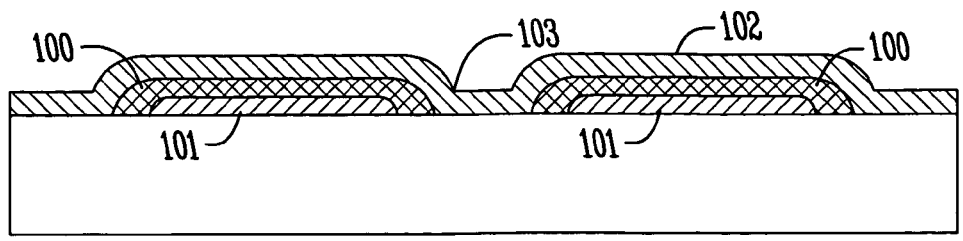
FIG. 1 is a schematic drawing of a molecular ruler structure 100 formed on top of a metal host structure 101 with a deposited material 102 coating the entire structure.
Figure 2:
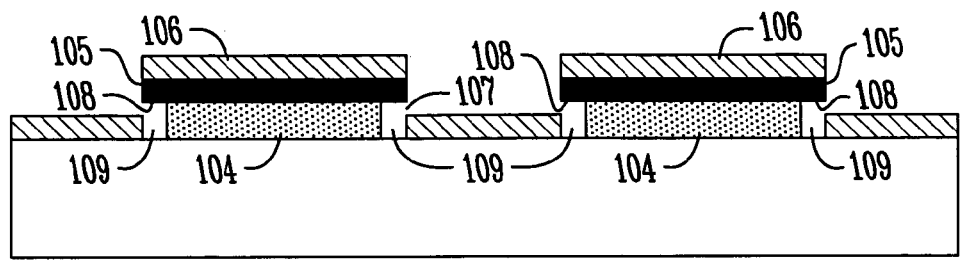
FIG. 2 is a schematic drawing of a typical lift-off structure consisting of 2 resist layers 104 and 105 and a deposited material 106.

Another issue is that the process for using a host metal directly on top of a substrate for defining a layer of organic material useful for a lift-off process is not practical. A lift-off process requires a "ledge" to allow the deposited material to "break" to form a pattern. By placing the host metal directly on top of the substrate, this ledge cannot be achieved. This is shown in FIGS. 1 and 2. FIG. 1 depicts a schematic drawing of a molecular ruler structure 100 formed on top of a metal host structure 101 with a deposited material 102 coating the entire structure. No break in the material is present in location 103. FIG. 2 depicts a schematic drawing of a typical lift-off structure consisting of two resist layers 104 and 105 and a deposited material 106. In this case, there is a clear break 107 in the deposited material. In this case a lift-off is very reproducible since solvent dissolving the resist layers 104 and 105 can enter under the ledge 108 and lift-off the material located on top of the resist layers. This also allows materials to be deposited with thicknesses greater than the host layer thickness. Using the two layer process described here, deposited material thicknesses are limited essentially by the sacrificial layer thickness. Also, the opening 109 can be produced using electron beam lithography, optical lithography, imprint lithography, and step-and-flash lithography, and the resists 104 and 105 can be of many types are typically not identical. The bottom layer 104 is often a special resist such as the resist LOR offered my MicroChem.

The present invention provides for elimination of the difficulties described above by implementing a bilayer resist process. In this case, a material such as a metal compatible with the molecular ruler formation is placed between the resist layers 104 and 105 in FIG. 2. Ideally, the material used for the resists is not stripped with or does not otherwise interfere with the molecular ruler solutions. On example of a suitable resist is MicroChem resist LOR.

More specifically, according to one embodiment of the present invention, the process for forming molecular rulers includes the following steps:

1) Deposit a layer of resist onto the surface of the substrate. This may be a standard resist or, in particular, the resist LOR offered by MicroChem. For example, spin-on MicroChem LOR and process as described in the process instructions from MicroChem. The substrate can be silicon, silicon dioxide or glass, for example. The present invention, is not of course limited to this particular resist or this particular substrate.

2) Deposit a layer of metal. For example, deposit 20 nm of gold using thermal evaporation. Although gold is generally preferred, the present invention contemplates that other types of materials can be used.

3) Deposit a second layer of resist. For example, spin-on a second layer of Shipley 1805 and process as described in the process instructions from Shipley. Of course, the present invention contemplates that other types of resist may be used.

4) Expose sample using optical lithography and a desired mask. Of course, if other resists are used, this process could be performed using electron beam lithography or the other lithography processes mentioned above.

5) Develop a top layer resist using standard processes producing a pattern in the top layer of resist.

6) Using that patterned top layer of resist, etch the exposed metal. For example, etch the 20 nm of gold using reactive ion etching. An example of an etch for gold is a CL:CF4:O2 plasma with 15 sccm of Cl, 15 sccm of CF4 and 5 sccm of O2 with 300 W power at 10 mT. Of course, the present invention contemplates that other etches may be used, including wet chemical etches.

7) Develop the now exposed layer of resist to open the feature completely down to the substrate surface. This layer will have been exposed again to ultraviolet light during the etching process, but that will mainly impact the development process time. If another non-uv sensitive resist is used as a bottom layer such as a LOR resist, then the exposure will not impact the standard process for developing the bottom layer. In the case of LOR, this process consists of removing the LOR in the feature region by soaking the wafer in Shipley CD-26 for a predetermined time depending upon LOR thickness and bake time and temperature.

8) If desired, do an additional O2 plasma etch to remove any residual resist on the surface of the wafer and to slightly expose the metal layer in between the two resists.

9) Use exposed metal layer to form a molecular ruler as disclosed by Dr. Anat Hatzor and Prof. Paul Weiss (*Science*, volume 291, pp. 1019-1020, 2001).

10) Deposit material. For example, evaporate a layer of gold or aluminum or copper.

11) Remove all host material by soaking wafer in a solvent such as acetone in an ultrasonic bath, if desired. If the resist LOR is used as a sacrificial layer, then remove all host material by soaking in Shipley CD-26.

12) If any residual material remains, strip again in a solvent such as an appropriate ACT solvent (from Ashland Chemicals) using the standard process.

Thus one specific embodiment of the present invention has been described. Of course the present invention contemplates numerous variations in the materials used.

Figure 3:
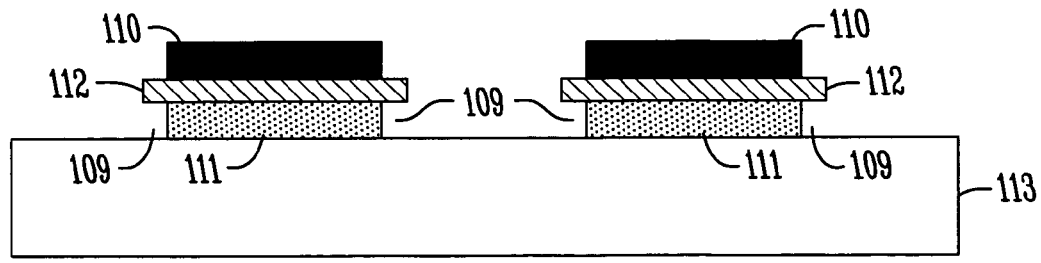
FIG. 3 is a schematic drawing of the structure produced through steps 1-8. The figure depicts the bottom and top layers of resist 110 and 111 with a metal layer 112 in between the resist layers all on top of a substrate 113.

FIG. 3 depicts a schematic drawing of the structure produced through steps 1-8. The figure depicts the bottom and top layers of resist 110 and 111 with a metal layer 112 in between the resist layers all on top of a substrate 113.

Figure 4:
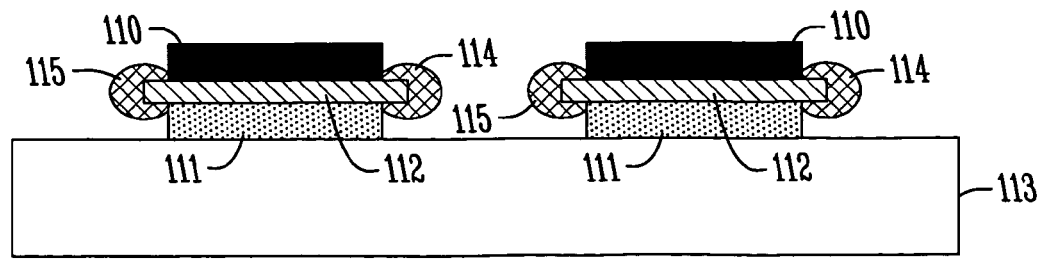
FIG. 4 is a schematic drawing of the structure after the formation of the molecular rulers 114 and 115 during step 9 of one embodiment of the present invention.

FIG. 4 depicts a schematic drawing of the structure after the formation of the molecular rulers 114 and 115 during step 9.

Figure 5:
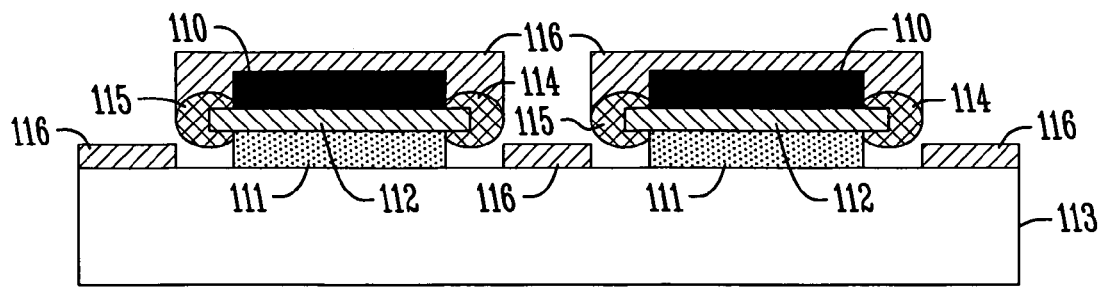
FIG. 5 is a schematic drawing of the structure after the deposition of a metal during step 10 of one embodiment of the present invention.

FIG. 5 depicts a schematic drawing of the structure after the deposition of a metal 116 during step 10.

Figure 6:
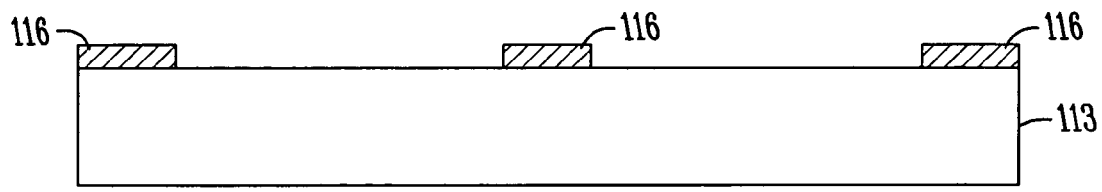
FIG. 6 is a schematic drawing of the patterned metal after removal of the host structure and molecular rulers in steps 11-12 of one embodiment of the present invention.

FIG. 6 depicts a schematic drawing of the patterned metal 116 after removal of the host structure and molecular rulers in steps 11-12.

All the individual steps discussed above other than those involving the molecular rulers are standard processes in the semiconductor processing industry. The other advantage of this process is that the top layer of resist covers the metal which is used to assemble the molecular rulers. In volume production, this will significantly reduce the amount of organic molecules needed to form the molecular rulers and reduce solution depletion. This step is optional.

The present invention contemplates many possible variations in the process described herein. The present invention is not to be limited to the preferred embodiment disclosed herein.

In one example of an alternative embodiment of the present invention, a method is provided that etches a mesa into the substrate material using the host metal or other material as a mask. This process may not be compatible with IC processing, for example, since the molecular ruler fabrication may often need to be performed on top of other previously fabricated structures.

In another alternative embodiment of the present invention, the lift-off process is replaced with a pattern and etch process. Specifically, the molecular ruler is used as an etch mask for patterning a previously deposited material. To obtain nanometer features using this process, reactive ion etching is used. The organic materials used to form molecular rulers are not resistant to plasma etching, making this alternative not practical.

This invention also extends to other sacrificial layers other than resists including LOR. For example, the sacrificial layer can be a dielectric such as silicon dioxide or silicon nitride. In come cases where a glass surface is used, even silicon can be used as a sacrificial layer. The sacrificial layer can also be a metal which is dissimilar from the host. For example, the metal nickel can be used which can be selectively etched over gold, for example.

Figure 7:
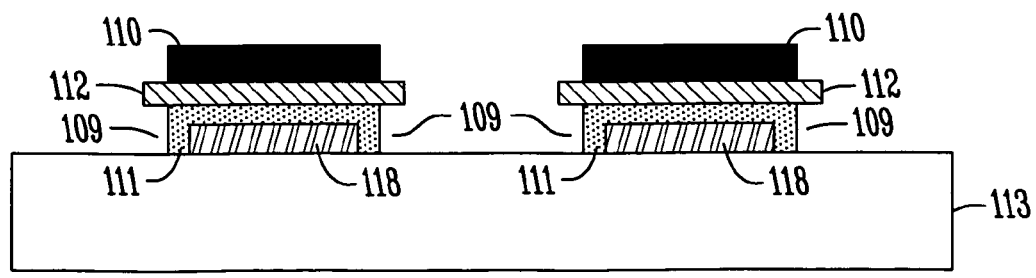
FIG. 7 is a schematic drawing of a structure produced through steps 1-8 of one embodiment of the present invention.

In the particular case where LOR is used as a sacrificial layer, stripping of LOR in CD-26 can be simplified by using a sacrificial layer which contains 2 layers as shown in FIG. 7. FIG. 7 is identical to FIG. 3 except that the sacrificial layer has been modified to include a second resist layer 118 which is different from the resist 111. In this case, the resist 111 is LOR. The resist 118 can be, for example, Shipley 1805 or UV-5. Since CD-26 strips LOR slowly, the structure shown in FIG. 7 can allow the removal of the sacrificial layer to be performed more quickly by modifying Step 11 above as follows:

Modified Step 11) Remove all host material by soaking first in CD-26 for a short time to remove LOR exposing the resist (such as Shipley 1805 or UV-5) then lift-off by stripping the resist in a solvent such as acetone, in an ultrasonic bath, if desired.

Therefore, method for producing host structures and nanoscale patterns have been disclosed. The present invention is not to be limited to the specific embodiments described herein, as one skilled in the art having the benefit of this disclosure would understand that numerous variations exist.

According to another embodiment of the present invention, the following process can be used.
1) Spun-on LOR on an oxidized silicon wafer at 4000 RPM for 40 seconds and baked at 200 C for 10 min.
2) Evaporated 20 nm of gold.
3) Patterned Shipley SPR3012 by spinning on at 4000 RPM for 40 seconds and then baking at 110 C for 90 seconds. Resist was then exposed using a contact aligner and a test mask for 6 sec at a power density of 12 mW/cm2. Sample was then subjected to a post exposure bake at 110 C for 90 seconds. Resist was developed for 1 minute and 10 seconds in CD-26.
4) Performed plasma ash to clean surface of resist for 25 seconds in O2:Ar 40 sccm:2 sccm at 150 W, 200 mT pressure, at a 100V DC bias.
5) Etched gold using reactive ion etching in Cl:CF4:O2 plasma with 15 sccm of Cl, 15 sccm of CF4 and 5 sccm of O2 with 300 W of power at a pressure of 10 mT for 1 minute and 5 seconds.
6) Removed SPR3012 in acetone under ultrasonic agitation then IPA-DI.
7) Removed exposed LOR in the feature window by soaking sample in CD-26:DI water (1:1) for 40 seconds.
8) Assemble molecular ruler structure.
9) Deposit 75 nm of Platinum.
10) Soaked sample in CD-26 for 40 seconds or more to remove LOR sacrificial layer and lift-off host structure.

Figure 8:
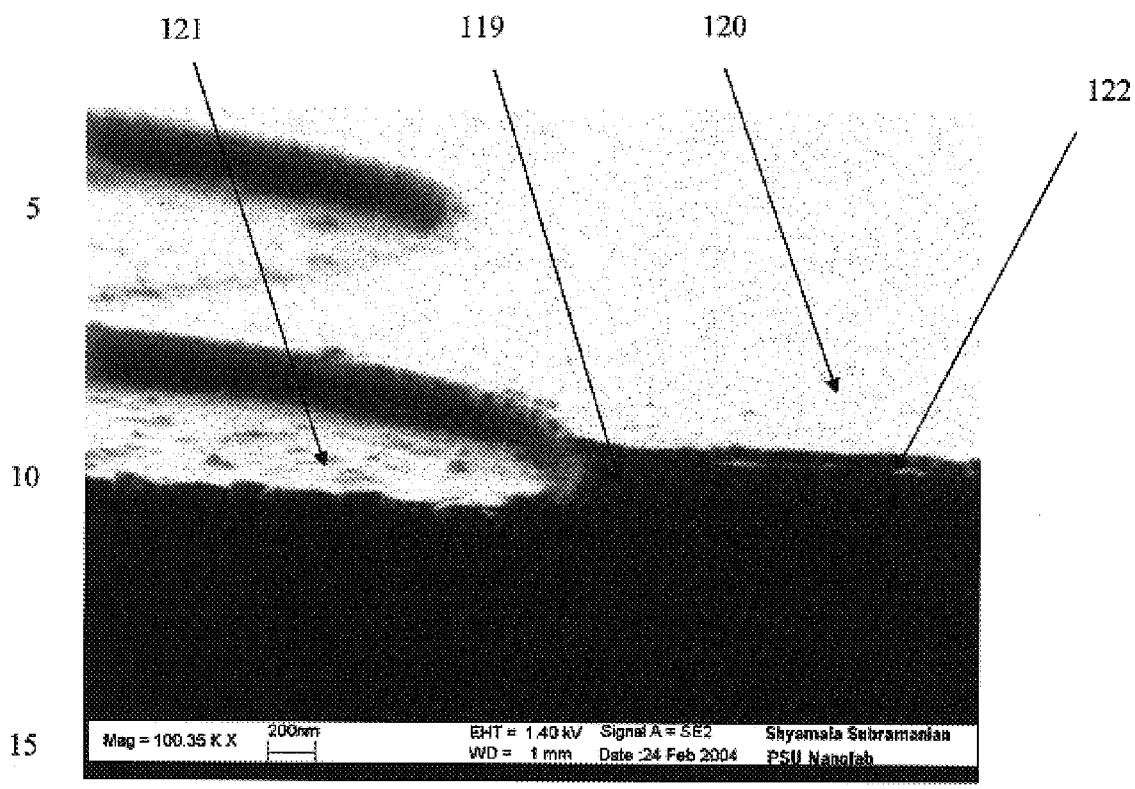
FIG. 8 is a scanning electron microscopy image of a sample prepared following steps 1-9 of one embodiment of the present invention

FIG. 8 depicts a scanning electron microscope image of a sample prepared following steps 1-9 of this embodiment. In the figure, the sacrificial resist LOR 119 is visible as is the 75 nm evaporated Platinum layer 120 and 121 and the 20 nm gold host layer 122. The molecular rulers are present on the host layer but not visible. A subsequent soak in CD-26 removed the sacrificial layer, host layer and the evaporated Platinum layer 120 but not the evaporated Platinum 121. This basic process can be implemented using any optical or electron beam process and is scalable to any feature size or geometry attainable using these methods.

Thus, it should be apparent from one having the benefit of this disclosure that the present invention contemplates numerous variations regarding the specific methodology used, the materials used and other variations. The present invention is not to be limited merely to the specific embodiments described herein.

What is claimed is:

1. A system comprising:
a molecular ruler;
a host structure for the formation of a molecular ruler, comprising:
a first layer of sacrificial material disposed upon a surface of a substrate;
a host material layer disposed upon a surface of the first layer of sacrificial material, the host material layer for assembling the molecular ruler;
a second layer of sacrificial material disposed upon the host material layer, wherein said second layer of sacrificial material covers at least partially the top surface of the host material layer to reduce amount of organic molecules needed to form the molecular ruler;

an opening extending from the second layer of sacrificial material to the surface of the substrate exposing a side of the layer of the host material; and wherein the molecular ruler being assembled on the host material layer of the host structure.

2. The system of claim 1 wherein the sacrificial material is a resist.

3. The system of claim 1 wherein the sacrificial material is an organic resist.

4. The system of claim 2 wherein the sacrificial material is LOR.

5. The system of claim 1 wherein the sacrificial material is a dielectric.

6. The system of claim 5 wherein the sacrificial material is silicon dioxide or silicon nitride.

7. The system of claim 1 wherein the sacrificial material is a metal.

8. The system of claim 7 wherein the sacrificial material is nickel.

9. The system of claim 1 wherein the opening is produced through optical lithography.

10. The system of claim 1 wherein the opening is produced through electron beam lithography.

11. The system of claim 1 wherein the opening is produced through imprint lithography.

12. The system of claim 1 wherein the opening is produced through step and flash lithography.

13. A host structure for the formation of a molecular ruler, comprising:

a first layer of sacrificial material disposed upon a surface of a substrate;

a second layer of sacrificial material disposed on top of and fully encapsulating the first layer of sacrificial material;

a host material layer disposed upon a surface of the second layer of sacrificial material;

a third layer of sacrificial material disposed upon the host material layer;

an opening extending from the second layer of sacrificial material to the surface of the substrate exposing a side of the layer of the host material.

14. The host structure of claim 13 wherein at least one of the sacrificial material layers is a resist.

15. The host structure layer of claim 13 where the resist is LOR.

16. The host structure of claim 13 wherein at least one of the sacrificial material layers is a dielectric.

17. The host structure of claim 13 wherein at least one of the sacrificial material layers is a metal.

18. The host structure of claim 13 wherein the first sacrificial material layer is Shipley UV-5 and the second sacrificial material layer is LOR.

* * * * *

UNITED STATES PATENT AND TRADEMARK OFFICE
CERTIFICATE OF CORRECTION

PATENT NO. : 7,585,334 B2
APPLICATION NO. : 11/065742
DATED : September 8, 2009
INVENTOR(S) : Catchmark et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 535 days.

Signed and Sealed this

Fourteenth Day of September, 2010

David J. Kappos
*Director of the United States Patent and Trademark Office*